United States Patent
Shomori et al.

(10) Patent No.: US 10,615,059 B2
(45) Date of Patent: Apr. 7, 2020

(54) SUBSTRATE PROCESSING DEVICE

(71) Applicant: J.E.T. CO., LTD., Asakuchi-gun, Okayama (JP)

(72) Inventors: Hirofumi Shomori, Okayama (JP); Atsuo Kimura, Okayama (JP)

(73) Assignee: J.E.T. CO., LTD., Asakuchi-gun, Okayama (JP)

( * ) Notice: Subject to any disclaimer, the term of this patent is extended or adjusted under 35 U.S.C. 154(b) by 134 days.

(21) Appl. No.: 15/736,032

(22) PCT Filed: Jun. 13, 2016

(86) PCT No.: PCT/JP2016/067492
§ 371 (c)(1),
(2) Date: Dec. 13, 2017

(87) PCT Pub. No.: WO2016/204106
PCT Pub. Date: Dec. 22, 2016

(65) Prior Publication Data
US 2018/0190515 A1    Jul. 5, 2018

(30) Foreign Application Priority Data
Jun. 15, 2015 (JP) .................................. 2015-120309

(51) Int. Cl.
*H01L 21/67* (2006.01)
*H01L 21/687* (2006.01)
(Continued)

(52) U.S. Cl.
CPC ............ *H01L 21/6708* (2013.01); *B08B 3/08* (2013.01); *B08B 3/102* (2013.01);
(Continued)

(58) Field of Classification Search
CPC ..... B08B 3/08; B08B 3/102; H01L 21/68771; H01L 21/6708; H01L 21/67086; H01L 21/31111
See application file for complete search history.

(56) References Cited

U.S. PATENT DOCUMENTS 5,875,804 A * 3/1999 Tanaka .................. B08B 3/10
134/182
6,045,624 A * 4/2000 Kamikawa ........ H01L 21/67034
134/30
(Continued)

FOREIGN PATENT DOCUMENTS

| JP | 3214503 B2 | 10/2001 |
| JP | 2002-134467 A | 5/2002 |

(Continued)

OTHER PUBLICATIONS

Notification of Reason for Refusal of corresponding KR application No. 2017-7027431 dated Dec. 15, 2017 and English machine translation thereof.

*Primary Examiner* — Benjamin L Osterhout
(74) *Attorney, Agent, or Firm* — Muncy, Geissler, Olds & Lowe, P.C.

(57) ABSTRACT

A substrate processing device (10) for processing a plurality of substrates disposed at predetermined intervals includes a processing bath (12) that is configured to store processing liquid, and has a side surface (13) extending along a thickness direction of the plurality of substrates, and a discharge unit (14) that is disposed in a bottom portion of the processing bath (12), and is configured to discharge processing liquid in an upward direction toward the side surface (13).

10 Claims, 14 Drawing Sheets

(51) Int. Cl.
  *H01L 21/311* (2006.01)
  *B08B 3/10* (2006.01)
  *B08B 3/08* (2006.01)

(52) U.S. Cl.
  CPC .. *H01L 21/31111* (2013.01); *H01L 21/67086* (2013.01); *H01L 21/68771* (2013.01)

(56) References Cited

U.S. PATENT DOCUMENTS

| | | | | |
|---|---|---|---|---|
| 6,131,588 | A * | 10/2000 | Kamikawa | B08B 3/08 134/102.3 |
| 6,352,083 | B1 * | 3/2002 | Araki | H01L 21/67051 134/56 R |
| 2006/0041176 | A1 * | 2/2006 | Enda | C23G 1/08 588/320 |
| 2006/0060232 | A1 * | 3/2006 | Tsurusaki | H01L 21/6708 134/56 R |
| 2006/0157197 | A1 * | 7/2006 | Maegawa | H01L 21/67086 156/345.18 |
| 2006/0213542 | A1 * | 9/2006 | Abiko | B08B 3/04 134/61 |
| 2007/0000524 | A1 * | 1/2007 | Kimura | H01L 21/67028 134/42 |
| 2008/0105286 | A1 * | 5/2008 | Kizawa | H01L 21/67051 134/56 R |
| 2009/0008364 | A1 | 1/2009 | Schweckendiek et al. | |
| 2009/0080879 | A1 * | 3/2009 | Osawa | G03D 3/02 396/626 |
| 2009/0239384 | A1 * | 9/2009 | Fujiwara | H01L 21/67057 438/745 |
| 2013/0056037 | A1 * | 3/2013 | Terashima | H01L 21/67057 134/34 |
| 2016/0271658 | A1 * | 9/2016 | Rebstock | H01L 21/67028 |

FOREIGN PATENT DOCUMENTS

| | | |
|---|---|---|
| JP | 2007-208223 A | 8/2007 |
| JP | 2009-81240 A | 4/2009 |
| JP | 2009-81257 A | 4/2009 |
| KR | 20090031988 A | 3/2009 |

* cited by examiner

SUBSTRATE PROCESSING DEVICE

TECHNICAL FIELD

The present invention relates to a substrate processing device of a semiconductor wafer or the like.

BACKGROUND ART

In a manufacturing process of a semiconductor device, for making a substrate surface clean, cleaning processing of processing a substrate using cleaning liquid is performed by eliminating part of films on the substrate and forming a desired pattern, or eliminating all of the films. As processing devices that perform such cleaning processing, there are known a single-wafer-type device that cleans substrates one by one, and a batch-type device that cleans a plurality of substrates by soaking the plurality of substrates in processing liquid in a processing bath in a state in which the plurality of substrates are held at predetermined intervals (e.g., Patent Literature 1).

In addition, in a manufacturing process of a semiconductor device, out of a silicon nitride film ($Si_3N_4$ film) and a silicon dioxide film ($SiO_2$ film) that are formed on a substrate such as a silicon wafer, the silicon nitride film is often selectively eliminated through etching performed by cleaning processing. Phosphoric acid ($H_3PO_4$) aqueous solution is often used as processing liquid for eliminating the silicon nitride film. Due to its properties, the phosphoric acid aqueous solution etches not only the silicon nitride film but also a slight amount of the silicon dioxide film. Because minute patterns are required of today's semiconductor devices, it becomes important to keep an etching rate constant for controlling an etching amount, and to keep a selection ratio, which is a ratio between respective etching rates of the silicon nitride film and the silicon dioxide film, constant.

CITATION LIST

Patent Literature

Patent Literature 1: Japanese Patent No. 3214503

SUMMARY OF INVENTION

Technical Problem

Conventional batch-type processing devices have such a problem that an etching rate locally drops on a substrate surface. For example, in a case where a conventional batch-type processing device processes a plurality of substrates for eliminating predetermined films on substrate surfaces, it is confirmed that removal characteristics of the films become non-uniform among the substrate surfaces, and it is demanded to uniformize the removal characteristics in the batch-type processing device.

If processing liquid is uniformly supplied onto the substrate surfaces, the etching rate is expected to become uniform. Nevertheless, such a batch-type processing device has not been obtained yet.

In view of the foregoing, the object of the present invention is to provide a substrate processing device that supplies, when processing a plurality of substrates disposed at predetermined intervals, processing liquid more uniformly onto front surfaces and rear surfaces of the substrates.

Solution to Problem

A substrate processing device according to the present invention is a substrate processing device for processing a plurality of substrates disposed at predetermined intervals, and includes a processing bath that is configured to store processing liquid, and has a side surface extending along a thickness direction of the plurality of substrates, and a discharge unit that is disposed in a bottom portion of the processing bath, and is configured to discharge processing liquid in an upward direction toward the side surface.

Advantageous Effects of Invention

According to the present invention, in the substrate processing device, a stream flow of the processing liquid discharged in the upward direction from the discharge unit toward the side surface of the processing bath circulates in the processing bath along the front surfaces and the rear surfaces of the substrates at large flow speed, and covers almost the entire regions of the front surfaces and the rear surfaces of the substrates.

Because the processing liquid is supplied more uniformly throughout almost the entire regions of the front surfaces and the rear surfaces of the substrates, when the plurality of substrates disposed at the predetermined intervals are processed, the substrate surfaces can be processed more uniformly.

BRIEF DESCRIPTION OF DRAWINGS

FIG. 8A illustrates a processing bath of the substrate processing device of the second embodiment, and FIG. 8B illustrates a processing bath of the substrate processing device of the first embodiment.

DESCRIPTION OF EMBODIMENTS

Embodiments according to the present invention will be described in detail below with reference to the drawings.

1. First Embodiment (Overall Configuration)

Figure 1:
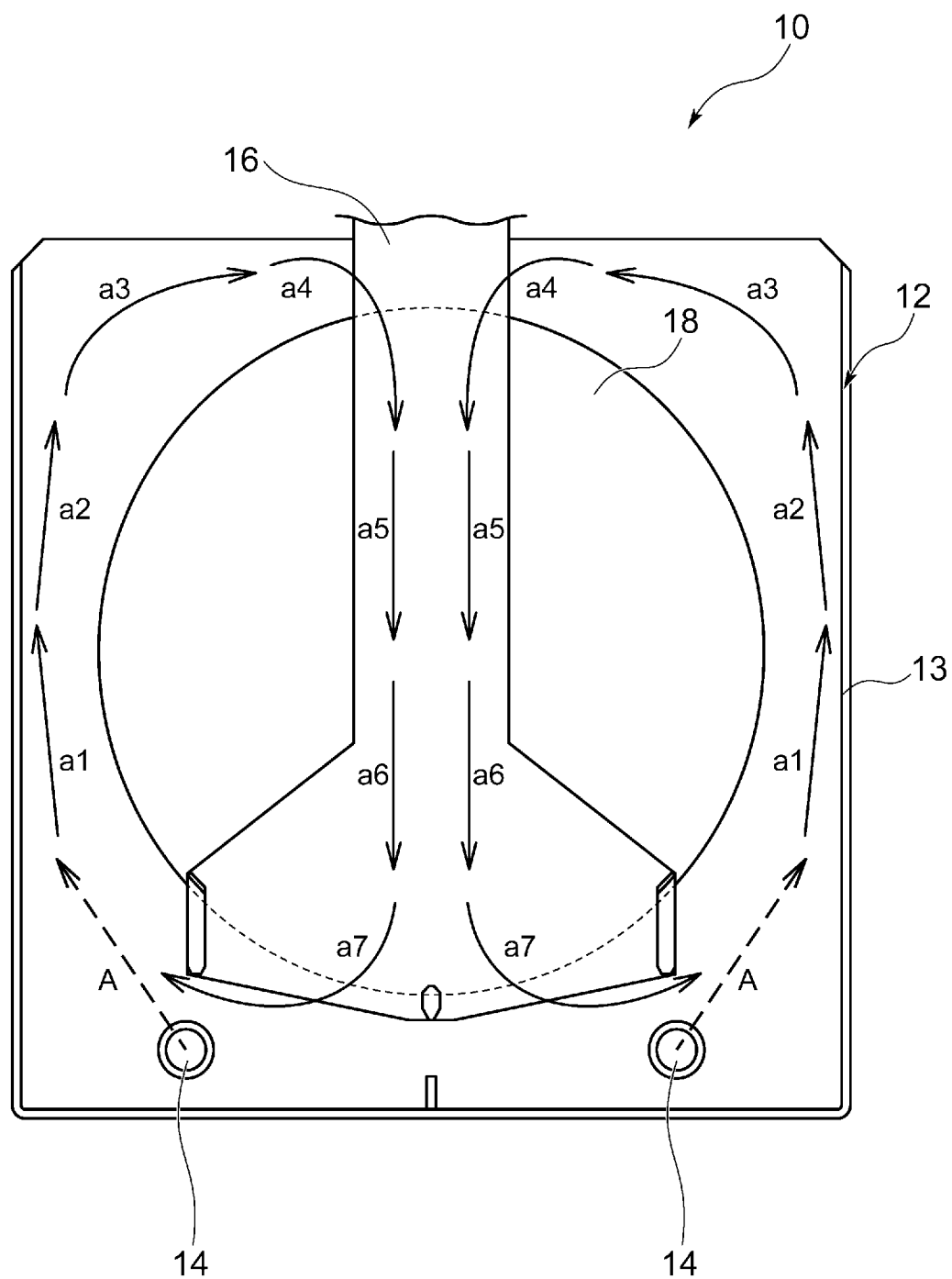
FIG. 1 is a schematic diagram illustrating a substrate processing device according to a first embodiment.

A substrate processing device 10 illustrated in FIG. 1 includes a processing bath 12 including a processing bath main body and an outer bath (not illustrated), and discharge units 14 that discharge processing liquid. The processing bath 12 has a box shape having a bottom surface and side surfaces provided integrally with the bottom surface, and has a rectangular upper opening. Material of the processing bath 12 is selected in accordance with the type of the processing liquid. For example, in a case where hydrofluoric acid is used as the processing liquid, the processing bath 12 is assumed to be made of polytetrafluoroethylene (PTFE). In a case where another type of processing liquid such as, for example, phosphoric acid is used, the processing bath 12 is assumed to be made of quartz. In the processing bath 12, a pair of surfaces extending in a direction perpendicular to a sheet surface are particularly regarded as side surfaces 13.

FIG. 1 illustrates a state in which a substrate 18 retained by a holder 16 is soaked in processing liquid (not illustrated) in the processing bath 12. The substrate 18 in this example is a semiconductor substrate. The holder 16 can array and store a plurality of substrates 18 in a direction extending along the side surfaces 13 of the processing bath 12. The plurality of substrates 18 can be disposed at predetermined intervals with front surfaces facing each other, rear surfaces facing each other, or front surfaces and rear surfaces facing each other. In the substrate processing device 10, the side surfaces 13 of the processing bath 12 are surfaces extending along a thickness direction of the plurality of arrayed substrates 18.

In the bottom portion of the processing bath 12, the discharge units 14 that discharge processing liquid are provided along the side surfaces 13. The discharge units 14 are supplied with processing liquid from a processing liquid tank (not illustrated) via a pump (not illustrated) or the like. The processing liquid flows in the discharge units 14 from one end toward another end of the discharge units 14, and is discharged in an upward direction (arrow A direction) from a discharge port (not illustrated) toward the side surfaces 13 of the processing bath 12. The upward direction refers to a direction upper than a horizontal direction. In the substrate processing device 10 illustrated in the drawing, the discharge units 14 are provided in the bottom portion of the processing bath 12 along the respective facing side surfaces 13 of the processing bath 12. With this configuration, the processing liquid can be discharged toward each of the facing side surfaces 13.

A direction in which the processing liquid is discharged from the discharge units 14 is not especially limited as long as the direction is an upward direction heading for the side surfaces 13 of the processing bath 12. Nevertheless, it is desirable to cause the direction to head for an outside of a lower end of the holder 16 that retains the substrates 18.

Furthermore, it is preferable that the discharge units 14 can discharge the processing liquid from a plurality of locations along the array of the plurality of substrates 18. The discharge port from which the processing liquid is discharged is desired to be provided in a region between the substrates 18 disposed at the predetermined intervals.

In the present embodiment, tubular members provided a plurality of discharge ports on side surfaces are arranged along a length direction so as to be used as the discharge units 14. In this case, the tubular members are disposed in the bottom portion of the processing bath 12 along the side surfaces 13 so that the discharge ports face the arrow A direction.

In the substrate processing device 10, etching removal of silicon nitride films on the surfaces of the substrates 18 can be performed using, for example, phosphoric acid as the processing liquid.

Movement and Effect

In the substrate processing device 10 of the first embodiment, the discharge units 14 that discharge the processing liquid in the upward direction (arrow A direction) toward the side surfaces 13 of the processing bath 12 are provided in the bottom portion of the processing bath 12 along the side surfaces 13. If the processing liquid is discharged from the discharge units 14 in the arrow A direction, stream flows as indicated by arrows $a1$, $a2$, $a3$, $a4$, $a5$, $a6$, and $a7$ are generated in the processing liquid.

First of all, in accordance with discharge pressure, stream flows move upward in outer edge vicinities of the substrates 18 along the side surfaces 13 of the processing bath 12 ($a1$, $a2$, and $a3$). A center vicinity of the substrates 18 that is distant from the side surfaces 13 of the processing bath 12 is not affected by the rising stream flows. Thus, the stream flows that have moved upward along the side surfaces 13 of the processing bath 12 basically flow into the center vicinity of the substrates 18 ($a3$ and $a4$). Part of the stream flows that have moved upward in the processing bath 12 along the side surfaces 13 overflows from the upper opening of the processing bath 12 and flows into the outer bath, which is not illustrated in the drawing for the sake of simplification.

Together with particles that have peeled from the surfaces of the substrates 18, the stream flows that have flowed into the center vicinity of the substrates 18 drop toward the bottom portion of the processing bath 12 in accordance with gravity ($a5$ and $a6$). The stream flows that have dropped toward the bottom portion of the processing bath 12 head for the directions of the discharge units 14 ($a7$), and join stream flows discharged from the discharge units 14. The joined stream flows move upward along the side surfaces 13 of the processing bath 12 as mentioned above, and circulate in the processing bath 12 along the front surfaces and the rear surfaces of the substrates 18.

Together with the particles, part of the stream flows that have moved upward overflows from the upper opening of the processing bath 12, and flows into the outer bath (not illustrated). The processing liquid that has flowed into the outer bath is introduced into the discharge units 14 through an introduction path including a pump (not illustrated), a heater (not illustrated), and a filter (not illustrated) in this order in a flow direction. The particles in the processing liquid to be introduced into the discharge units 14 through the introduction path are eliminated by passing through the filter.

In this manner, by discharging the processing liquid in the upward direction (arrow A direction) from the discharge units 14 toward the side surfaces 13 of the processing bath 12, regions on the front surfaces and the rear surfaces of the substrates 18 that are provided on the side surface 13 sides are covered by the stream flows a1 to a7. In the substrate processing device 10, the two discharge units 14 are provided in the bottom portion along the respective facing side surfaces 13 of the processing bath 12. Thus, by discharging the processing liquid in the upward direction from these two discharge units 14 toward the respective side surfaces 13, the processing liquid is supplied to almost the entire regions of the front surfaces and the rear surfaces of the substrates 18.

Figure 2:
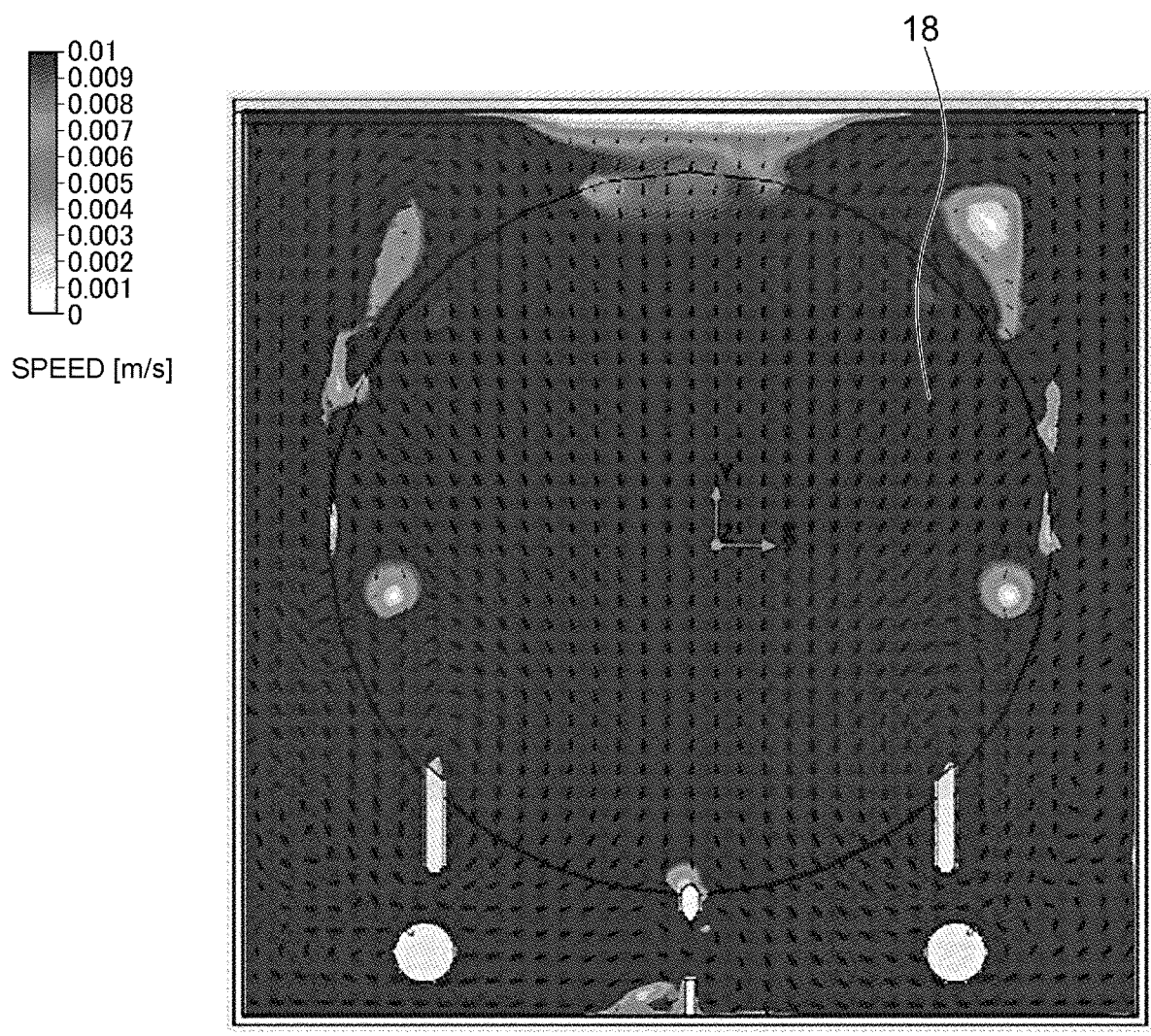
FIG. 2 is a simulation result obtained by analyzing stream flows in the substrate processing device of the first embodiment.

A simulation result as illustrated in FIG. 2 has been obtained by analyzing the stream flows in the substrate processing device 10 of the first embodiment. Contrasting density of colors in FIG. 2 indicates the magnitude of flow speed of stream flows. The contrasting density indicates that a portion with a darker color has larger flow speed of a stream flow. In FIG. 2, a portion with the darkest color extends throughout almost the entire regions of the front surfaces and the rear surfaces of the substrates 18. Based on the foregoing, it can be identified that, when the substrate processing device 10 processes the substrates 18, stream flows of the processing liquid with large flow speed are generated, and the processing liquid is uniformly supplied, throughout almost the entire regions of the front surfaces and the rear surfaces of the substrates 18.

Because the processing liquid is supplied more uniformly throughout almost the entire regions of the front surfaces and the rear surfaces of the substrates 18, the use of the substrate processing device 10 of the present embodiment has enabled processing to be performed more uniformly on the surfaces of the substrates 18.

Figure 3:
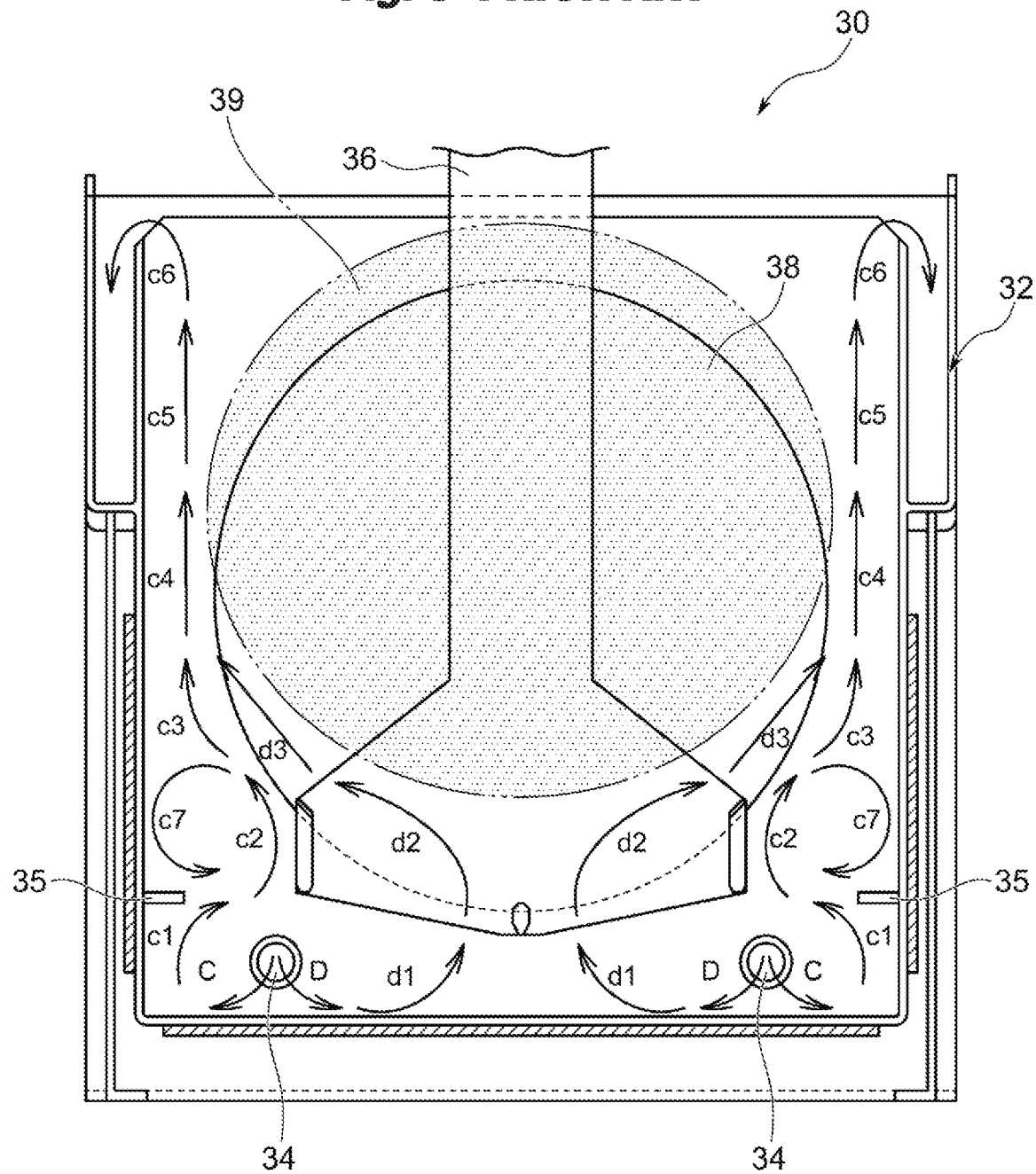
FIG. 3 is a schematic diagram illustrating an example of a conventional substrate processing device.

In conventional substrate processing devices, processing liquid is not uniformly supplied throughout the entire regions of the front surfaces and the rear surfaces of substrates. An example of a conventional substrate processing device will be described with reference to FIG. 3. Similarly to the case of FIG. 1, FIG. 3 illustrates a state in which a substrate 38 retained by a holder 36 is soaked in processing liquid (not illustrated) in a processing bath 32. In a substrate processing device 30 illustrated in FIG. 3, rectifying plates 35 are provided in side surface bottom portions of the processing bath 32. Discharge units 34 disposed in a bottom portion of the processing bath 32 discharge processing liquid in two directions (arrow C direction and arrow D direction) toward the bottom surface of the processing bath 32.

The outward discharge in the arrow C direction from the discharge units 34 generates stream flows heading for the rectifying plates 35 on the side surfaces from the bottom surface of the processing bath 32 (c1). The stream flows head for the substrate 38 (c2), move upward in outer edge vicinities of the substrate 38 (c3, c4, and c5), and overflow from an upper opening of the processing bath 32 (c6). Aside from the stream flows (c3) moving upward in the outer edge vicinities of the substrate 38, stream flows heading for the rectifying plates 35 on the side surfaces of the processing bath 32 are also generated (c7).

On the other hand, by inward discharge in the arrow D direction from the discharge units 34, stream flows move upward toward the substrate 38 from the bottom surface of the processing bath 32 (d1), head for an outer edge upward direction of the substrate 38 (d2 and d3), and join the stream flows (c4) moving upward in the processing bath 12.

The generation of the above-described stream flows (c1 to c7 and d1 to d3) generates a region 39 in which no stream flow flows, in the conventional substrate processing device 30.

Figure 4:
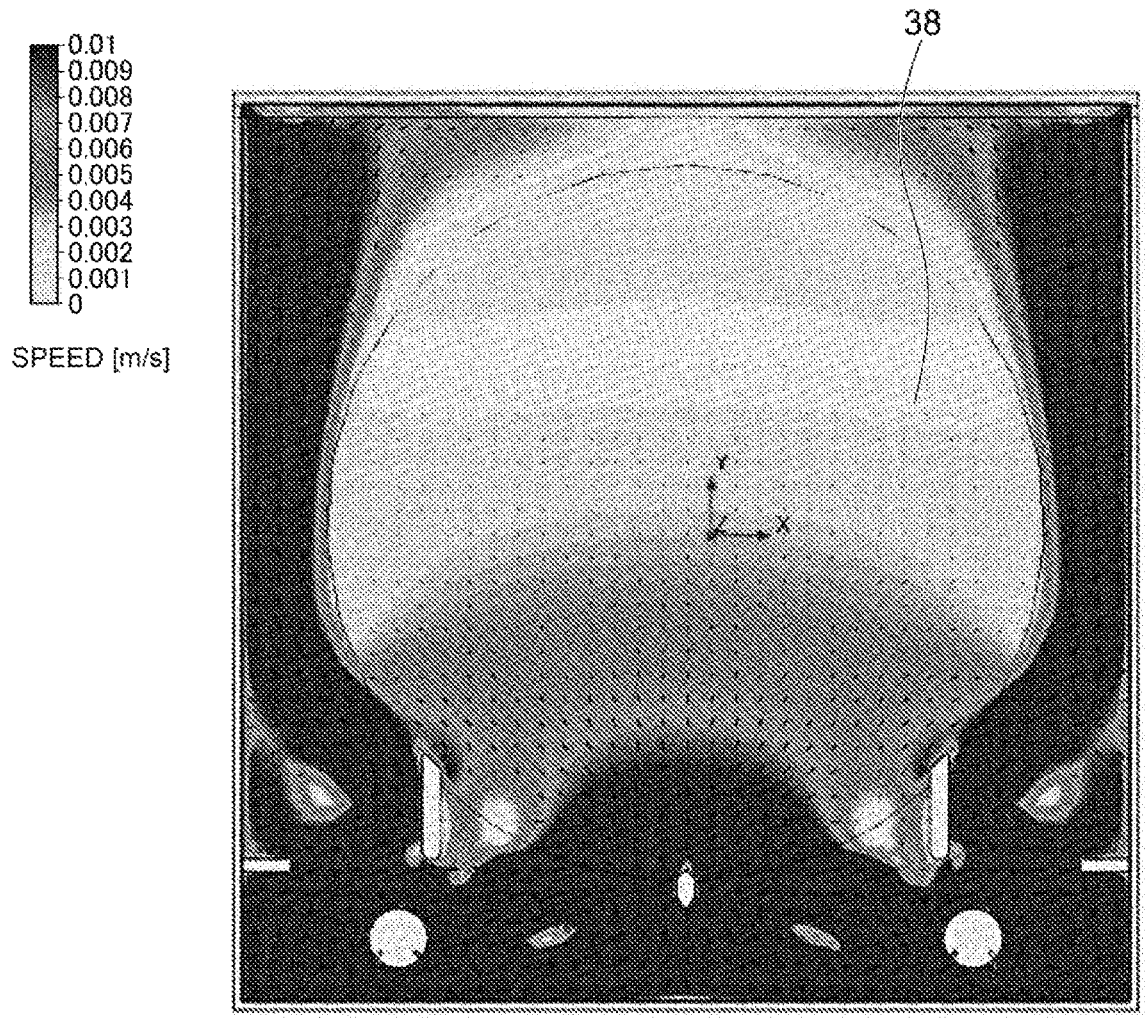
FIG. 4 is a simulation result obtained by analyzing stream flows in an example of a conventional substrate processing device.

A simulation result as illustrated in FIG. 4 has been obtained by analyzing the stream flows in the conventional substrate processing device 30. Similarly to the case of FIG. 2, also in FIG. 4, contrasting density of colors indicates the magnitude of flow speed of stream flows, and a portion with a darker color has larger flow speed. In FIG. 4, a portion with the darkest color is limited to a small part of the front surface and the rear surface of the substrate 38. A portion with a pale color in FIG. 4 corresponds to the region 39 in which no stream flow flows that is illustrated in FIG. 3. When the conventional substrate processing device 30 processes the substrate 38, a portion in which a stream flow flows at large flow speed is only a small part of the front surface and the rear surface of the substrate 38, and stream flows with large flow speed do not flow in most parts of the front surface and the rear surface of the substrate 38. It is identified that, in the conventional substrate processing device 30, the processing liquid is not uniformly supplied throughout the entire regions of the front surface and the rear surface of the substrate 38.

In this manner, the processing liquid is not uniformly supplied throughout the entire regions of the front surface and the rear surface of the substrate 38. Thus, in a case where the conventional substrate processing device 30 is used, processing cannot be uniformly performed on the surfaces of the substrate 38.

Figure 5:
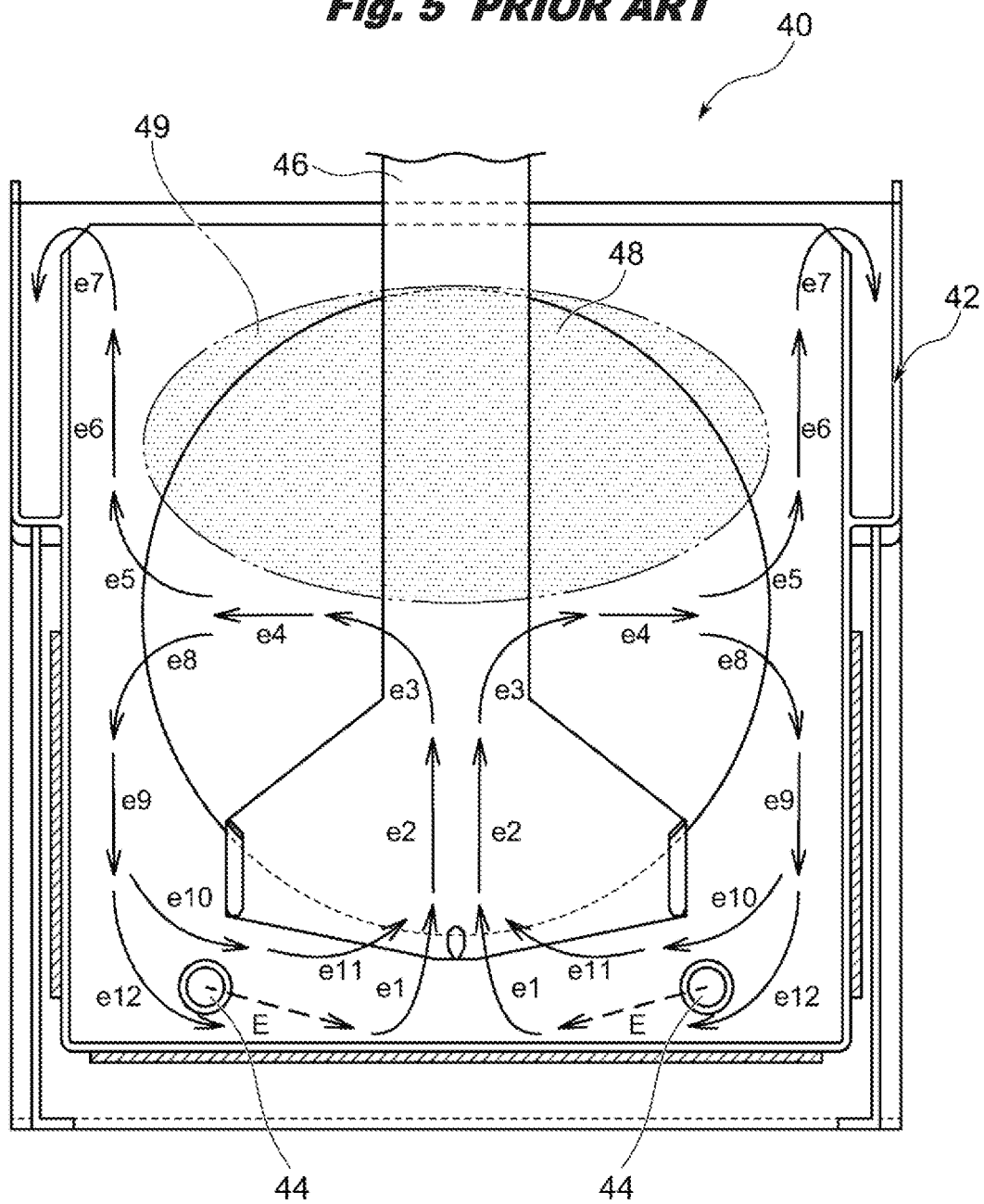
FIG. 5 is a schematic diagram illustrating another example of a conventional substrate processing device.

Another example of a conventional substrate processing device will be described with reference to FIG. 5. Similarly to the cases of FIGS. 1 and 3, FIG. 5 illustrates a state in which a substrate 48 retained by a holder 46 is soaked in processing liquid (not illustrated) in a processing bath 42. A substrate processing device 40 illustrated in FIG. 5 is a substrate processing device obtained by removing the rectifying plates 35 in the side surface bottom portions of the processing bath 32 from the substrate processing device 30 illustrated in FIG. 3, and changing the discharge directions from the discharge units 34 to only one direction. In the substrate processing device 40, discharge units 44 discharge processing liquid in an arrow E direction oriented to a bottom surface inner side of the processing bath 42.

The discharge in the arrow E direction generates stream flows moving upward toward the substrate 48 from the bottom surface of the processing bath 42 (e1). The stream flows move upward in a center vicinity of the substrate 48 (e2), and head for outer edges of the substrate 48 (e3 and e4). Part of the stream flows heading for the outer edges of the substrate 48 moves upward in outer edge vicinities of the substrate 48 (e5 and e6), and overflows in an upper opening of the processing bath 42 (e7). Remaining parts of the stream flows heading for the outer edges of the substrate 48 drop in the outer edge vicinities of the substrate 48 (e8 and e9), and head for the substrate 48 (e10 and e11). Aside from the stream flows heading for the substrate 48, stream flows heading for the discharge units 44 are also generated (e12).

The generation of the above-described stream flows (e1 to e12) generates a region 49 in which no stream flow flows, in the conventional substrate processing device 40.

Figure 6:
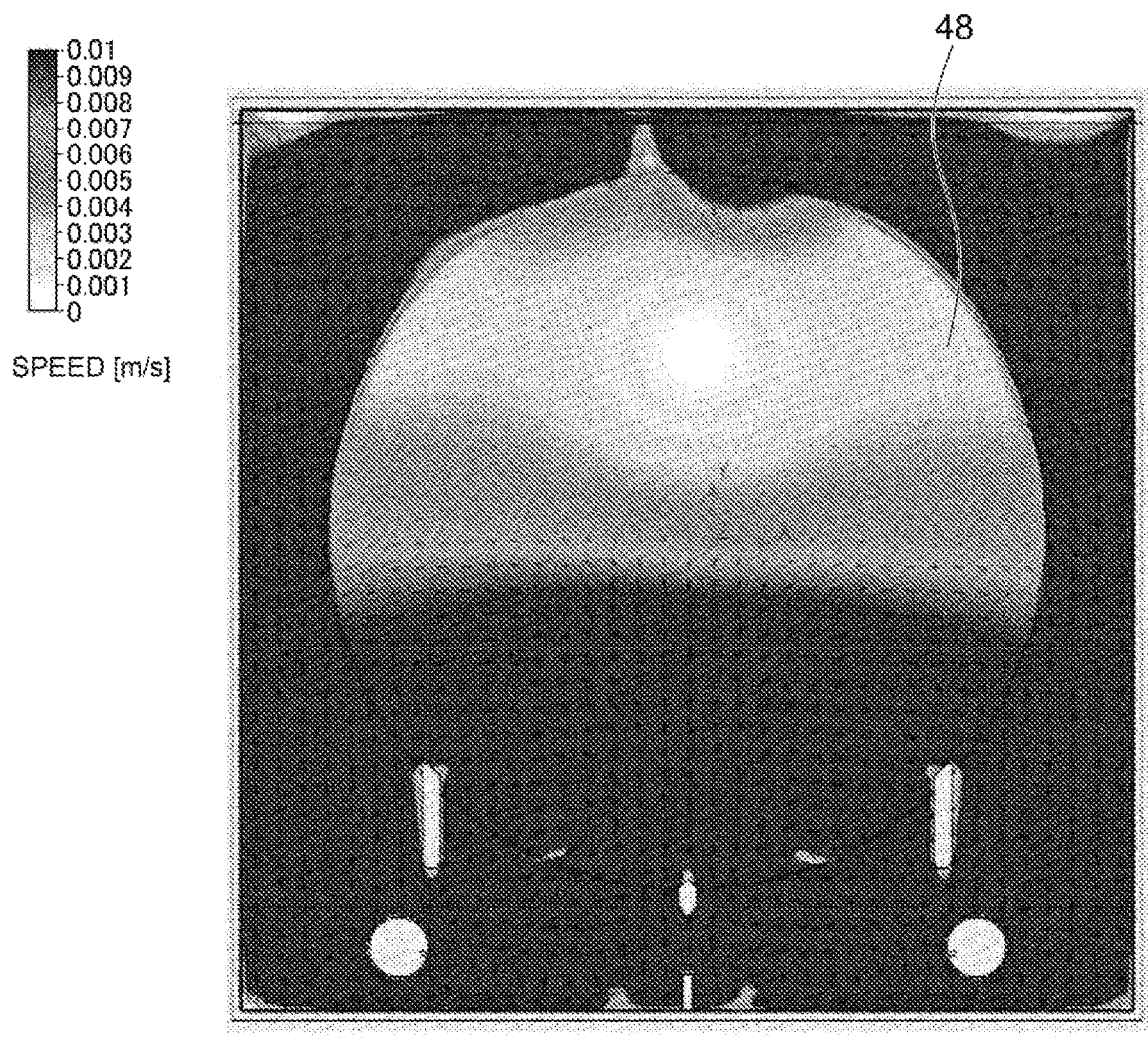
FIG. 6 is a simulation result obtained by analyzing stream flows in another example of a conventional substrate processing device.

A simulation result as illustrated in FIG. 6 has been obtained by analyzing the stream flows in the conventional substrate processing device 40. Similarly to the cases of FIGS. 2 and 4, also in FIG. 6, contrasting density of colors indicates flow speed of stream flows, and a portion with a darker color has larger flow speed. In FIG. 6, a portion with the darkest color is about a lower half of the front surface and the rear surface of the substrate 48. A portion with a pale color in FIG. 6 corresponds to the region 49 in which no stream flow flows that is illustrated in FIG. 5. When the conventional substrate processing device 40 processes the substrate 48, a portion in which a stream flow flows at large flow speed is about a lower half of the front surface and the rear surface of the substrate 48, and stream flows with large flow speed do not flow in a part corresponding to an upper half of the substrate 48. It is identified that, also in the conventional substrate processing device 40, the processing liquid is not uniformly supplied throughout the entire regions of the front surface and the rear surface of the substrate 48.

In this manner, the processing liquid is not uniformly supplied throughout the entire regions of the front surface and the rear surface of the substrate 48. Thus, even if the conventional substrate processing device 40 is used, processing cannot be uniformly performed on the surfaces of the substrate 48.

In contrast to this, in the substrate processing device 10 of the present embodiment, by discharging the processing liquid in the upward direction toward the side surfaces 13 of the processing bath 12, the processing liquid circulates in the processing bath 12 along the front surfaces and the rear surfaces of the substrates 18, so that almost the entire regions of the front surfaces and the rear surfaces of the substrates 18 can be uniformly covered with the processing liquid. As a result, it has become possible for the substrate processing device 10 of the present embodiment to perform processing more uniformly on the surfaces of the substrates 18.

2. Second Embodiment (Overall Configuration)

Figure 7:
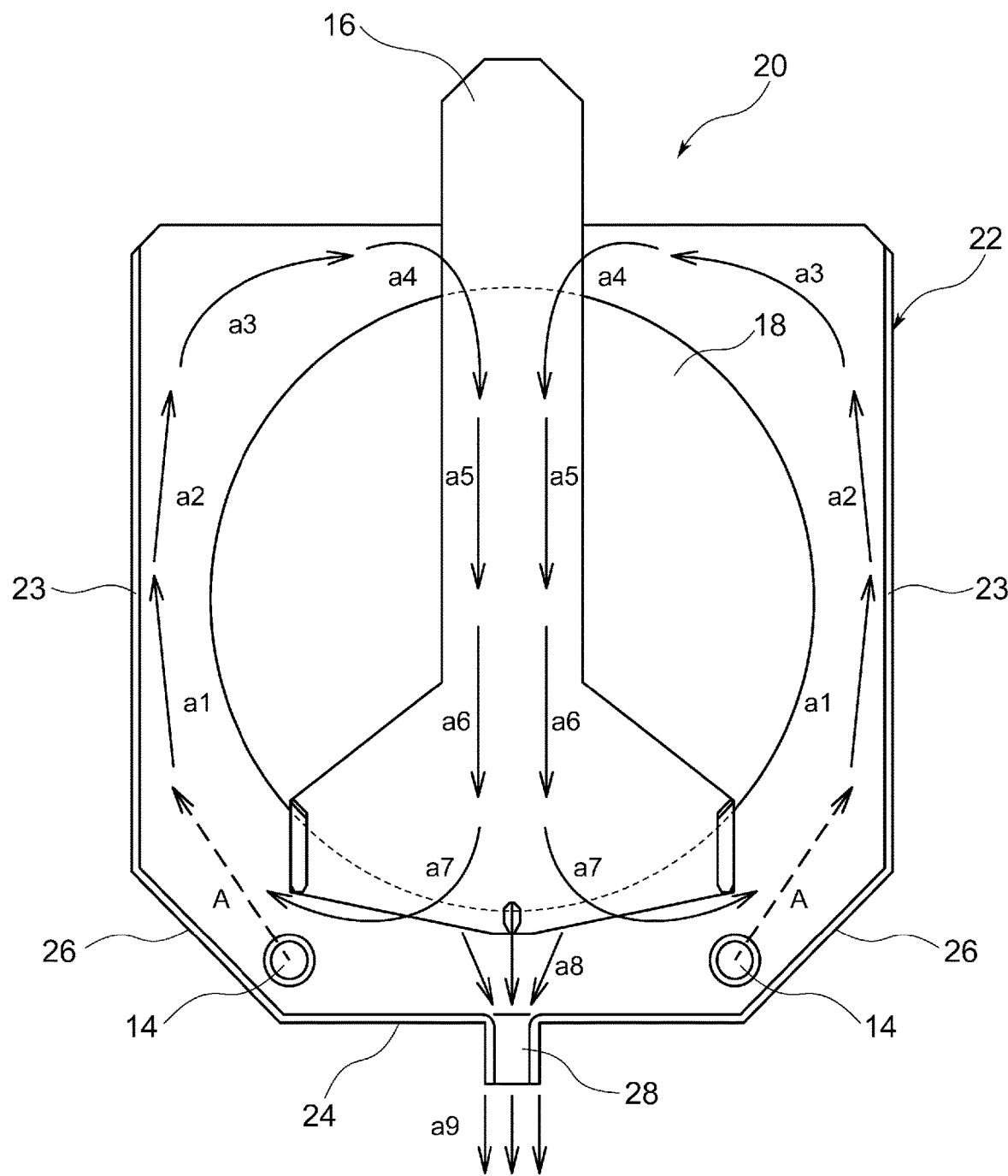
FIG. 7 is a schematic diagram illustrating a substrate processing device according to a second embodiment.

FIG. 7 illustrates a configuration of a substrate processing device 20 of a second embodiment. In the substrate processing device 20, side surfaces 23 of a processing bath 22 are connected to a bottom surface 24 via sloped surfaces 26. Furthermore, the bottom surface 24 of the processing bath 22 is provided with an drain port 28 and an introduction path (not illustrated) for introducing, into the discharge units 14, processing liquid drained from the drain port 28. The introduction path heading for the discharge units 14 from the drain port 28 is connected to an upstream of a pump in an introduction path heading for the discharge units 14 from an outer bath. Except for such different points, the substrate processing device 20 of the second embodiment has a configuration similar to that of the substrate processing device 10 of the first embodiment.

An angle of the sloped surfaces 26 in the processing bath 22 is not especially limited. The angle can be set to an arbitrary angle within a range in which the processing liquid is not prevented from heading for the side surfaces 23, considering a direction in which the processing liquid is discharged from the discharge units 14. In the present embodiment, an angle formed by the sloped surfaces 26 and a horizontal surface is about 45 degrees. The drain port 28 of the bottom surface 24 of the processing bath 12 is preferably provided in a groove shape along an array of the plurality of substrates 18, in the center vicinity of the pair of facing side surfaces 23. For example, the drain port 28 can be formed into a V-shaped groove extending along the array of the plurality of substrates 18.

Movement and Effect

Also in the substrate processing device 20 of the second embodiment, the stream flows (a1 to a7) similar to those in the substrate processing device 10 of the first embodiment are generated, and stream flows of the processing liquid with large flow speed are generated throughout almost the entire regions of the front surfaces and the rear surfaces of the substrates 18. Because the processing liquid is supplied more uniformly throughout almost the entire regions of the front surfaces and the rear surfaces of the substrates 18, also in the substrate processing device 20 of the second embodiment, processing can be performed more uniformly on the surfaces of the substrates 18 similarly to the case of the first embodiment.

Moreover, in the substrate processing device 20 of the second embodiment, the bottom surface 24 of the processing bath 22 is provided with the drain port 28. In the substrate processing device 20, processing of the substrates 18 is performed while predetermined amount of processing liquid being drained from the drain port 28. Thus, during the processing, stream flows (a8) heading for the drain port 28, and stream flows (a9) flowing out from the drain port 28 are generated. Such stream flows promote the dropping of the stream flows (a5 and a6), and also promote the circulation of stream flows in the processing bath 22. In the substrate processing device 20 of the second embodiment, uniformity of the processing liquid supplied onto the front surfaces and the rear surfaces of the substrates 18 is further enhanced.

In the substrate processing device 20 of the second embodiment, in addition to the overflow from an upper opening of the processing bath 22, liquid drain is performed from the drain port 28 provided on the bottom surface 24 of the processing bath 22. This also brings about such an effect that particles that have peeled from the surfaces of the substrates 18 and are moving in the processing bath 22 are eliminated from the processing bath 22 more promptly.

Figure 8A:
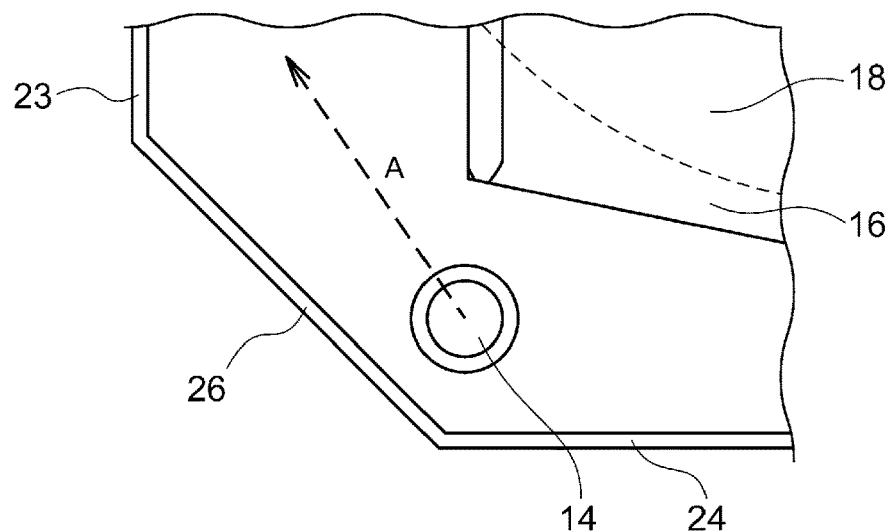
FIGS. 8A and 8B each is a partially-enlarged view of a lower end of a processing bath.
Figure 8B:
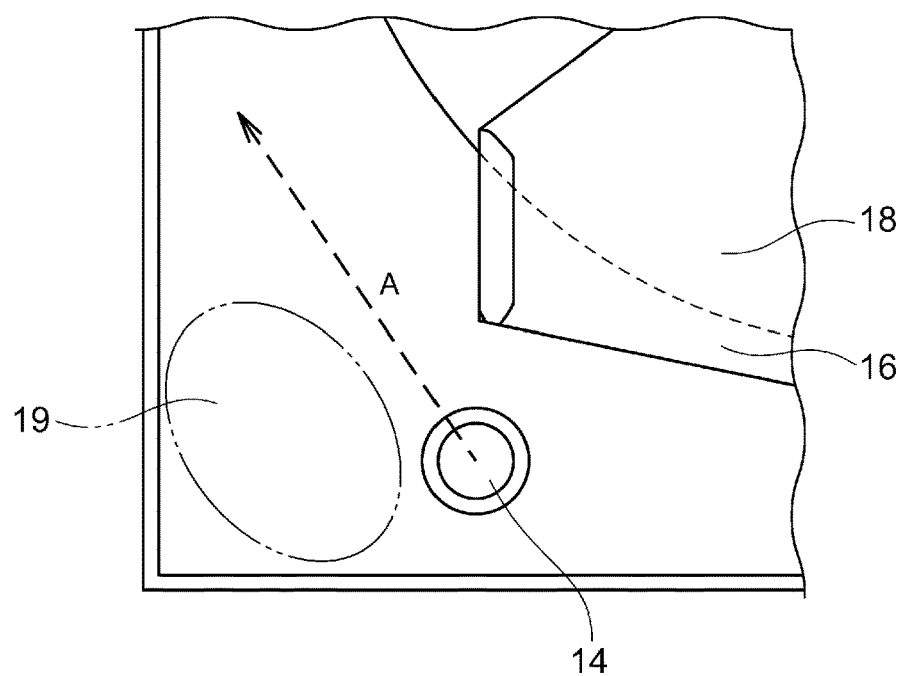

As illustrated in a partially-enlarged view in FIG. 8A, in the substrate processing device 20 of the second embodiment, the side surface 23 of the processing bath 22 is connected to the bottom surface 24 via the sloped surface 26. Thus, at a lower end of the processing bath 22 of the substrate processing device 20, a corner portion formed by the side surface 23 and the bottom surface 24 does not exist. In a case where a corner portion exists at a lower end of a processing bath as illustrated in FIG. 8B (the first embodiment), a stagnant region 19 is generated in the corner portion. The existence of the stagnant region 19 does not adversely affect the stream flows of the processing liquid, but in some cases, particles accumulate in the stagnant region 19.

By eliminating corner portions by providing the sloped surfaces 26 between the side surfaces 23 of the processing bath 22 and the bottom surface 24 as in the second embodiment, the generation of a stagnant region can be avoided. As a result, a possibility of accumulation of particles in the processing bath 22 is reduced. As mentioned above, the particles are guided to the outside of the processing bath 22 by the stream flows flowing out from the upper opening of the processing bath 22 or the drain port 28. Because the processing bath 22 has the sloped surfaces 26 in the bottom portion, capacity decreases as compared with that of a processing bath having corner portions in a bottom portion. A decrease in the capacity of a processing bath leads to a reduction in an amount of processing liquid required for processing of substrates.

3. Third Embodiment (Overall Configuration)

Figure 9:
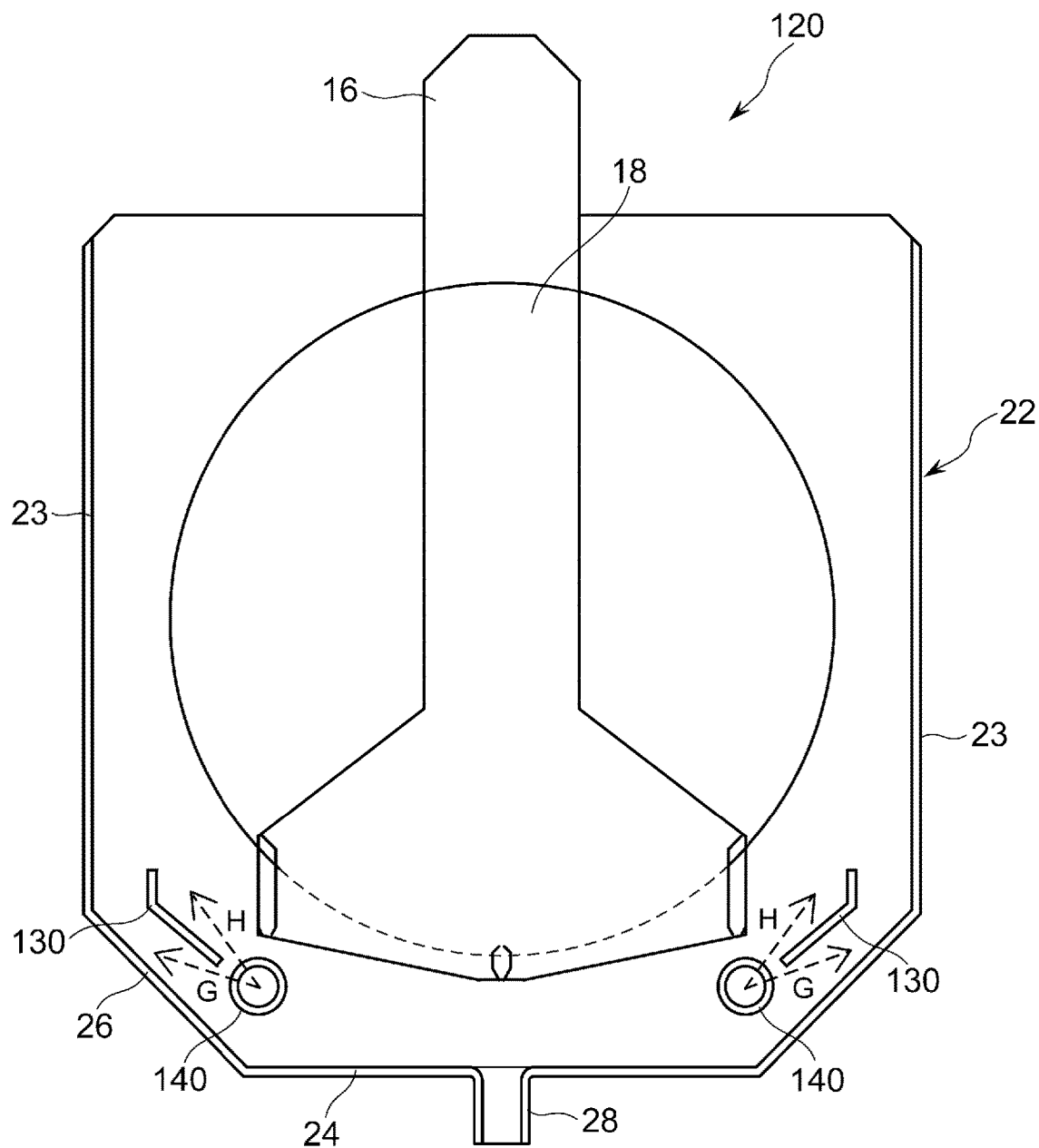
FIG. 9 is a schematic diagram illustrating a substrate processing device according to a third embodiment.

FIG. 9 illustrates a configuration of a substrate processing device 120 of a third embodiment. In the bottom portion of the processing bath 22, discharge units 140 are provided along the side surfaces 23. These discharge units 140 can discharge processing liquid toward two directions having different elevation angles. In the present embodiment, the processing liquid is discharged in an arrow H direction having a large elevation angle, and in an arrow G direction having a small elevation angle. Flow dividing plates 130 are provided between the discharge units 140 and the side surfaces 23 so as to separate the stream flows of the processing liquid discharged in the arrow H direction, and the stream flows of the processing liquid discharged in the arrow G direction, from each other. The flow dividing plates 130 extend in a direction perpendicular to the sheet surface, and both ends are fixed to the processing bath 22. Except for such different points, the substrate processing device 120 of the third embodiment has a configuration substantially-similar to that of the substrate processing device 20 of the second embodiment. Because the flow dividing plates 130 are included, the discharge units 140 are provided at a higher position at a distance from the bottom surface 24 of the processing bath 22, as compared with the discharge units 14 in the substrate processing device 20 of the second embodiment.

Figure 10:
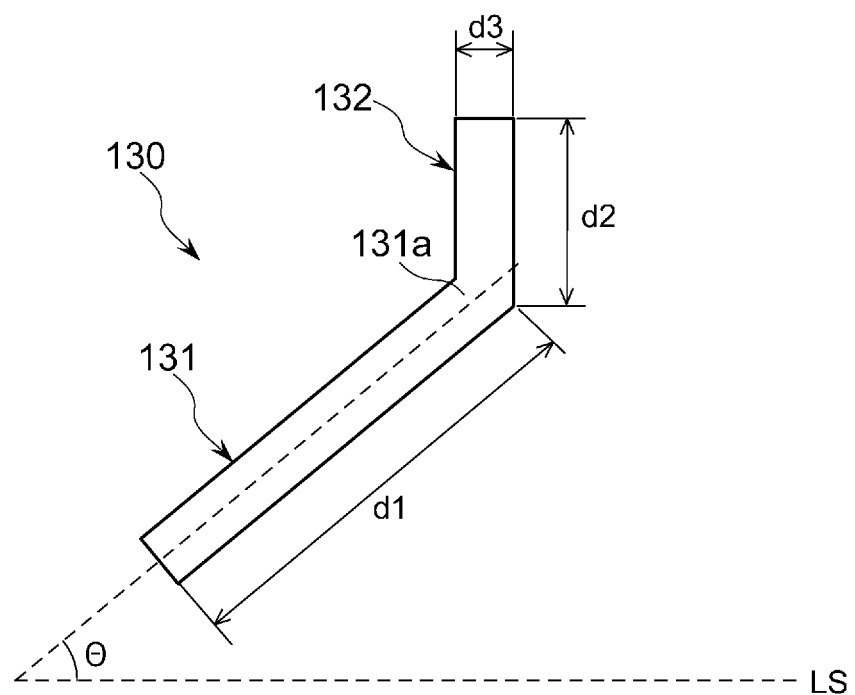
FIG. 10 is a schematic diagram illustrating a flow dividing plate in the substrate processing device of the third embodiment.

The flow dividing plates 130 can be plate-like members made of material similar to that of the processing bath 22. As illustrated in FIG. 10, the flow dividing plate 130 includes an inclined portion 131 provided on a discharge unit side, and an upstand portion 132 rising up from an upper end 131a of the inclined portion 131. The dimension of the flow dividing plates 130 is arbitrarily set in accordance with the dimension of the processing bath 22. For example, a length d1 of the inclined portion 131 can be set to about 30 to 70 mm, a length d2 of the upstand portion 132 can be set to about 10 to 30 mm, and a thickness d3 of the flow dividing plate 130 can be set to about 3 to 5 mm.

An angle (elevation angle Θ) formed by the inclined portion 131 and a horizontal surface LS is decided considering the angle of the sloped surfaces 26 in the processing bath 22. In the present embodiment, because the angle formed by the sloped surfaces 26 with the horizontal surface is about 45 degrees, the elevation angle Θ can be set to about 30 to 60 degrees. The elevation angle Θ is preferably smaller than the angle formed by the sloped surfaces 26 with the horizontal surface.

Figure 11:
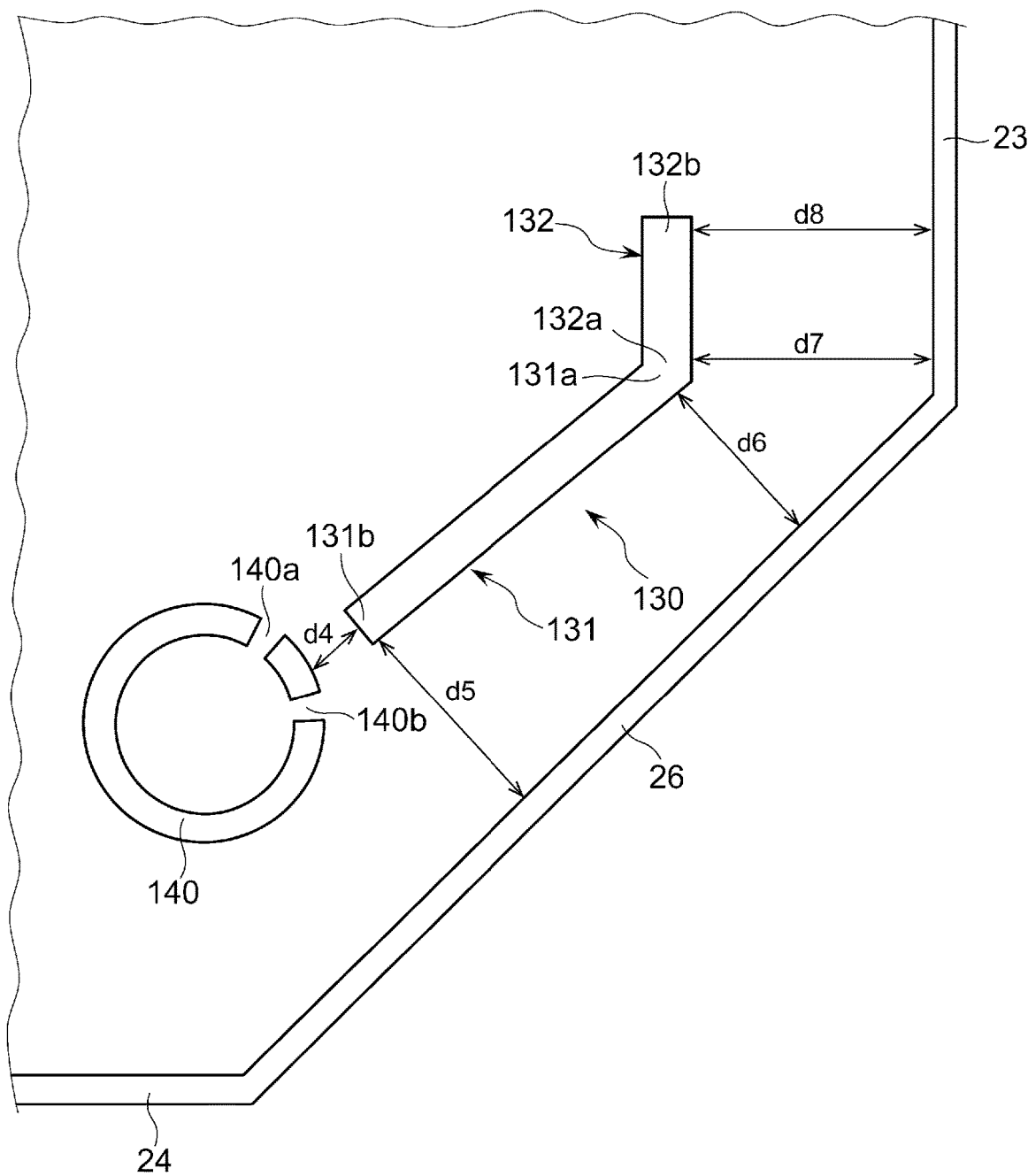
FIG. 11 is an enlarged view of a flow dividing plate vicinity in the substrate processing device of the third embodiment.

FIG. 11 illustrates an enlarged view of a vicinity of the flow dividing plate 130. FIG. 11 also illustrates the discharge unit 140 including a first discharge port 140a and a second discharge port 140b. An installation position of the flow dividing plate 130 can be appropriately set in accordance with the size of the processing bath 22. A distance d4 between a lower end 131b of the inclined portion 131 and the discharge unit 140 can be set to about 2 to 15 mm, for example. A distance d6 between the upper end 131a of the inclined portion 131 and the sloped surface 26 is preferably smaller than a distance d5 between the lower end 131b of the inclined portion 131 and the sloped surface 26.

In the present embodiment, the upstand portion 132 rises up from the upper end 131a of the inclined portion 131 along the side surface 23 of the processing bath 22. The upstand portion 132 preferably rises up so as to be parallel to the side surface 23, at a position on the outside of the outer edges of the substrates 18 that are closest to the side surface 23 of the processing bath 22. A distance d8 from the side surface 23 to a distal end 132b of the upstand portion 132 is desired to be equal to a distance d7 from the side surface 23 to a proximal end 132a of the upstand portion 132. The distances d7 and d8 from the side surface 23 can be set to about 5 to 30 mm, for example.

Figure 12:
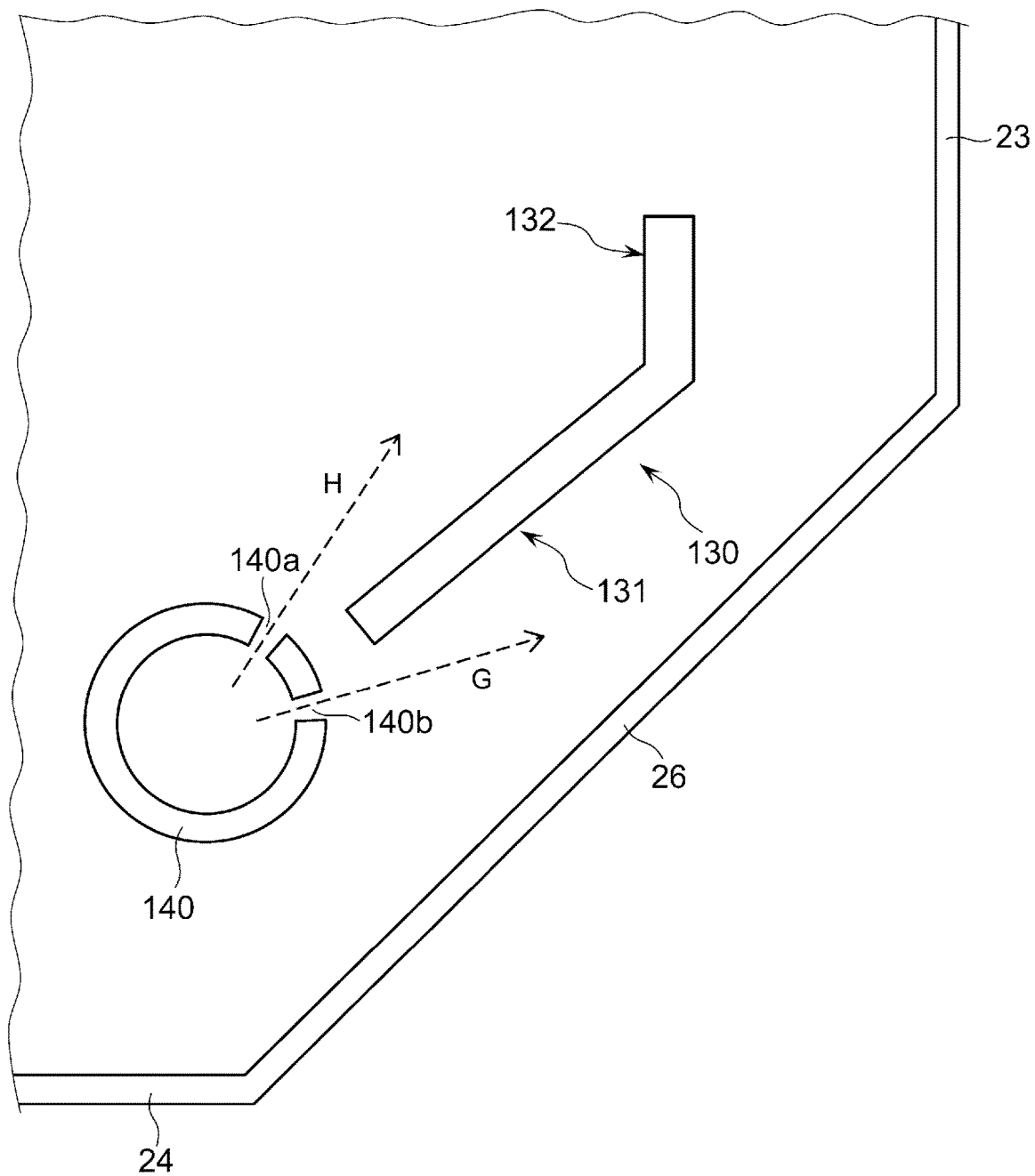
FIG. 12 is an enlarged view illustrating a discharge direction of processing liquid from a discharge unit in the substrate processing device of the third embodiment.

A discharge direction of processing liquid from the discharge unit 140 will be described with reference to FIG. 12. The discharge unit 140 includes the first discharge port 140a that discharges processing liquid in the arrow H direction (first direction). In the present embodiment, the first discharge port 140a is provided at a position corresponding to a portion between the substrates 18 disposed at the predetermined intervals, in a longitudinal direction extending along the side surface 23 of the processing bath 22. The arrow H direction is an upward direction oriented toward the side surface 23 of the processing bath 22. An elevation angle of the arrow H direction is not especially limited as long as the arrow H direction is oriented toward the upper side of the inclined portion 131 of the flow dividing plate 130. The arrow H direction is preferably set to a direction that does not go over the upper end of the upstand portion 132 of the flow dividing plate 130.

At a position lower than the first discharge port 140a of the discharge unit 140, the second discharge port 140b that discharges processing liquid in the arrow G direction (second direction) on the lower side of the flow dividing plate 130 is provided. A hole diameter of the second discharge port 140b is preferably about the same level as that of the first discharge port 140a. The second direction is lower than the first direction in which the processing liquid is discharged from the first discharge port 140a. A plurality of second discharge ports 140b are provided in the longitudinal direction extending along the side surface 23 of the processing bath 22, at intervals larger than that of the first discharge ports 140a. The intervals of the second discharge ports 140b in the longitudinal direction can be about four times of the interval of the first discharge ports 140a. Similarly to the first discharge ports 140a, the second discharge ports 140b can be provided at positions corresponding to portions between the substrates 18 disposed at the predetermined intervals. Alternatively, the second discharge ports 140b may be provided at positions corresponding to the substrates 18 disposed at the predetermined intervals.

The processing liquid is discharged from the second discharge port 140b in the arrow G direction. The arrow G direction illustrated in FIG. 12 is illustrated to be close to the sloped surface 26 of the processing bath 22. The discharge direction, however, is not limited to this. An angle of the arrow G direction can be arbitrarily set as long as the arrow G direction is an upward direction oriented toward the side surface 23 of the processing bath 22, on the lower side of the flow dividing plate 130.

Movement and Effect

Figure 13:
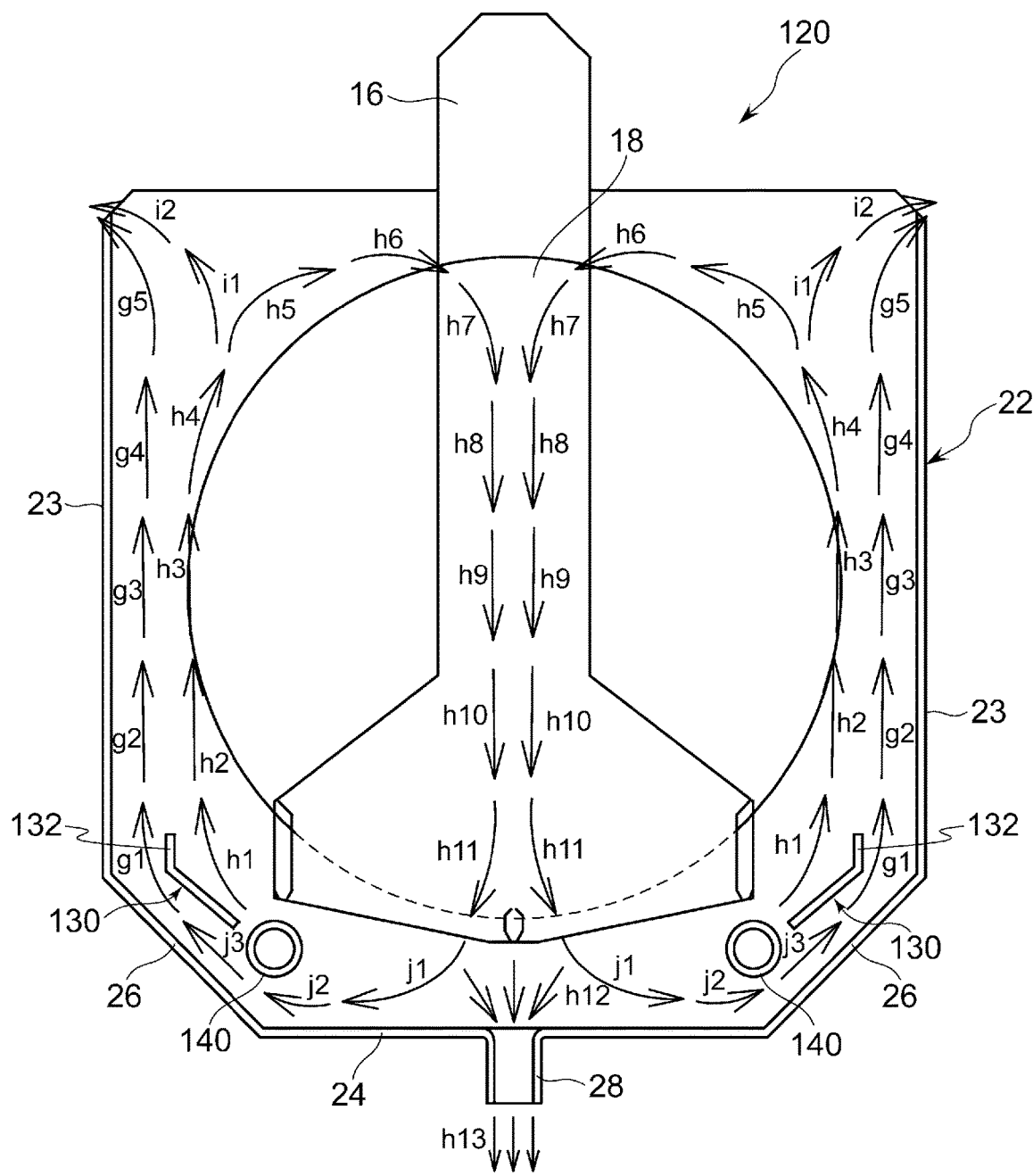
FIG. 13 is a schematic diagram illustrating stream flows in the substrate processing device according to the third embodiment.

As illustrated in FIG. 9, in the substrate processing device 120 of the third embodiment, the processing liquid is discharged from the discharge units 140 provided in the bottom portion of the processing bath 22 along the side surfaces 23, in two directions including the upper side of the flow dividing plates 130 (the arrow H direction) and the lower side of the flow dividing plates 130 (the arrow G direction). Because the flow dividing plates 130 include the upstand portions 132 in upper parts, stream flows as illustrated in FIG. 13 are formed in the processing bath 22 by the processing liquid discharged from the discharge units 140.

The processing liquid discharged in the arrow H direction on the upper side of the flow dividing plates 130 forms stream flows as indicated by arrows h1, h2, h3, h4, h5, h6, h7, h8, h9, h10, and h11. The stream flows h1 to h11 correspond to the stream flows a1 to a6 in the substrate processing device 10 of FIG. 1 and the substrate processing device 20 of FIG. 2, respectively. The above-described stream flows h1 to h11 contribute to processing of the substrates 18. On the other hand, the processing liquid discharged in the arrow G direction on the lower side of the flow dividing plates 130 forms stream flows g1 to g4 moving upward along the side surfaces 23, and stream flows g5 overflowing and flowing out from the upper opening, in regions close to the side surfaces 23 of the processing bath 22. The stream flows g1 to g4 function as attracting stream flows that guide stream flows that have been used in the processing of the substrates 18, and have dropped to the bottom portion of the processing bath 22, to the upper opening of a processing bath 23, and cause overflow.

In the present embodiment, because the second discharge ports 140b are provided at intervals larger than that of the first discharge ports 140a, from the viewpoint of the entire processing bath 22, stream flows of the processing liquid discharged to the lower side of the flow dividing plates 130 have momentum weaker than that of stream flows of the processing liquid discharged to the upper side of the flow dividing plates 130. The stream flows of the processing liquid discharged from the first discharge ports 140a can effectively contribute to the processing of the substrates 18 as indicated by the stream flows h1 to h11, without being attracted to the attracting stream flows g1 to g4.

First of all, the stream flows h1 to h11 contributing to the processing of the substrates 18 will be described. The flow dividing plates 130 having the upstand portions 132 in the upper parts are provided between the discharge units 140 and the side surfaces 23. Thus, the processing liquid discharged in the arrow H direction from the first discharge ports 140a of the discharge units 140 as illustrated in FIG. 12 forms the stream flows h1 oriented toward the direction upper than the arrow H direction (refer to FIG. 13). Because the stream flows h1 are oriented toward the upward direction, the stream flows (h2, h3, and h4) moving upward in the processing bath 22 are formed to move away from the side surfaces 23 of the processing bath 22, and move closer to the substrates 18, and to overlap the outer edges of the substrates 18 that are closest to the side surfaces 23 of the processing bath 22.

The center vicinity of the substrates 18 is not affected by stream flows discharged from the discharge units 140 and moving upward. The stream flows that have moved upward in the processing bath 22 in the vicinity of the substrates 18 basically flow in toward the center vicinity of the substrates 18 (h5, h6, and h7). In some cases, part of the stream flows that have moved upward in the vicinity of the substrates 18 overflows from an upper end opening of the processing bath 22, and flows out to an outer bath (not illustrated) (i1 and i2).

Together with particles that have peeled from the surfaces of the substrates 18, the stream flows that have flowed into the center vicinity of the substrates 18 drop toward the bottom portion of the processing bath 22 in accordance with gravity (h8, h9, h10, and h11). Part of the stream flows (h11) that have dropped heads for the drain port 28 (h12), and flows out from the drain port 28 as stream flows h13. The stream flows h12 and h13 correspond to the stream flows a8 and a9 in the substrate processing device 20 of the second embodiment. The stream flows h12 and h13 promote the dropping of the stream flows (h8, h9, h10, and h11) similarly to the case of the second embodiment.

In the present embodiment, by the processing liquid being discharged to the lower side of the flow dividing plates 130, the attracting stream flows (g1 to g4) are generated between the flow dividing plates 130 and the processing bath 22. Remaining parts of the stream flows that have dropped in the center vicinity of the substrates 18, and headed for the bottom portion of the processing bath 22 are attracted to these attracting stream flows. The stream flows that have dropped toward the bottom portion of the processing bath 22 head for portions between the discharge units 140 and the bottom surface 24 (j1), pass through the portions between the discharge units 140 and the bottom surface 24 (j2), and join the stream flows of the processing liquid discharged from the discharge units 140 (j3). As a result, momentum of stream flows moving on the lower side of the flow dividing plates 130 increases.

Because the flow dividing plates 130 having the upstand portions 132 in the upper parts are provided, stream flows containing particles join the attracting stream flows, move away from the substrates 18, and move upward in regions closer to the side surfaces 23 (g1, g2, and g3). Integrally with the attracting stream flows, the stream flows containing the particles move further upward in the processing bath 22 along the side surfaces 23 (g4), and then, overflow from the upper end opening of the processing bath 22, and flow out to the outer bath (not illustrated) (g5).

The stream flows (g1 to g4) moving upward in the processing bath 22 along the side surfaces 23 do not get mixed with the stream flows (h1 to h4) moving upward in the processing bath 22 in the vicinity of the substrates 18. Thus, there is a small possibility that particles in the processing liquid circulate and reattach to the substrates 18 in the processing bath 22. If the upstand portions 132 of the flow dividing plates 130 are positioned on the outside of the outer edges of the substrates 18 that are closest to the side surfaces 23 of the processing bath 22, the stream flows containing particles move further away from the substrates 18, and move upward in regions closer to the side surfaces 23. Thus, a possibility of reattachment of the particles to the substrates 18 becomes further smaller.

Also in the substrate processing device 120 of the third embodiment, similarly to the substrate processing device 10 of the first embodiment and the substrate processing device 20 of the second embodiment, the stream flows (h1 to h11) circulating in wide regions in the processing bath 22 are generated, and stream flows of the processing liquid with large flow speed are generated throughout almost the entire regions of the front surfaces and the rear surfaces of the substrates 18. Because the processing liquid is supplied more uniformly throughout almost the entire regions of the front surfaces and the rear surfaces of the substrates 18, also in the substrate processing device 120 of the third embodiment, similarly to the cases of the first and second embodiments, uniformity of processing on the surfaces of the substrates 18 can be enhanced.

Moreover, in the substrate processing device 120 of the third embodiment, similarly to the substrate processing device 20 of the second embodiment, the bottom surface 24 of the processing bath 22 is provided with the drain port 28. With this configuration, the stream flows (h13) flowing out from the drain port 28 are generated. Thus, similarly to the case of the second embodiment, also in the substrate processing device 120 of the third embodiment, uniformity of the processing liquid supplied onto the front surfaces and the rear surfaces of the substrates 18 is further enhanced. In addition to this, such an effect that particles in the processing liquid are promptly eliminated from the processing bath 22 is also obtained. Because the substrate processing device 120 is provided with the sloped surfaces 26 in the bottom portion of the processing bath 22, a possibility of accumulation of particles in the processing bath 22 is also reduced.

Furthermore, in the substrate processing device 120 of the third embodiment, because the processing liquid is discharged from the discharge units 140 in two directions separated by the flow dividing plates 130, aside from the stream flows (h1 to h11) contributing to the processing of the substrates 18, the attracting stream flows (g1 to g5) heading for the upper opening of the processing bath 22 are formed in the vicinities of the side surfaces 23.

After dropping toward the bottom portion of the processing bath 22, the processing liquid containing particles by passing through the insides of the surfaces of the substrates 18 passes through portions between the flow dividing plates 130 and the sloped surfaces 26, and joins the attracting stream flows. Because the flow dividing plates 130 having the upstand portions 132 in the upper parts are provided, the processing liquid containing particles moves away from the substrates 18, moves upward in regions close to the side surfaces 23 of the processing bath 22, and overflows to be drained from the upper opening (g5). This causes particles that have peeled from the surfaces of the substrates 18, to be immediately guided to the outside of the processing bath 22 without circulating in a processing bath 22. The particles in the processing bath 22 can be efficiently reduced, and a possibility of reattachment of the particles to the substrates 18 is also reduced.

From the upper opening of the processing bath 22, the stream flows containing particles that have joined the attracting stream flows preferentially overflow to flow out. A rate of processing liquid overflowing to flow out from the upper opening of the processing bath 22, with respect to the processing liquid discharged from the first discharge ports 140a for the processing of the substrates 18 is reduced. Accordingly, the use efficiency of the processing liquid also improves.

Figure 14:
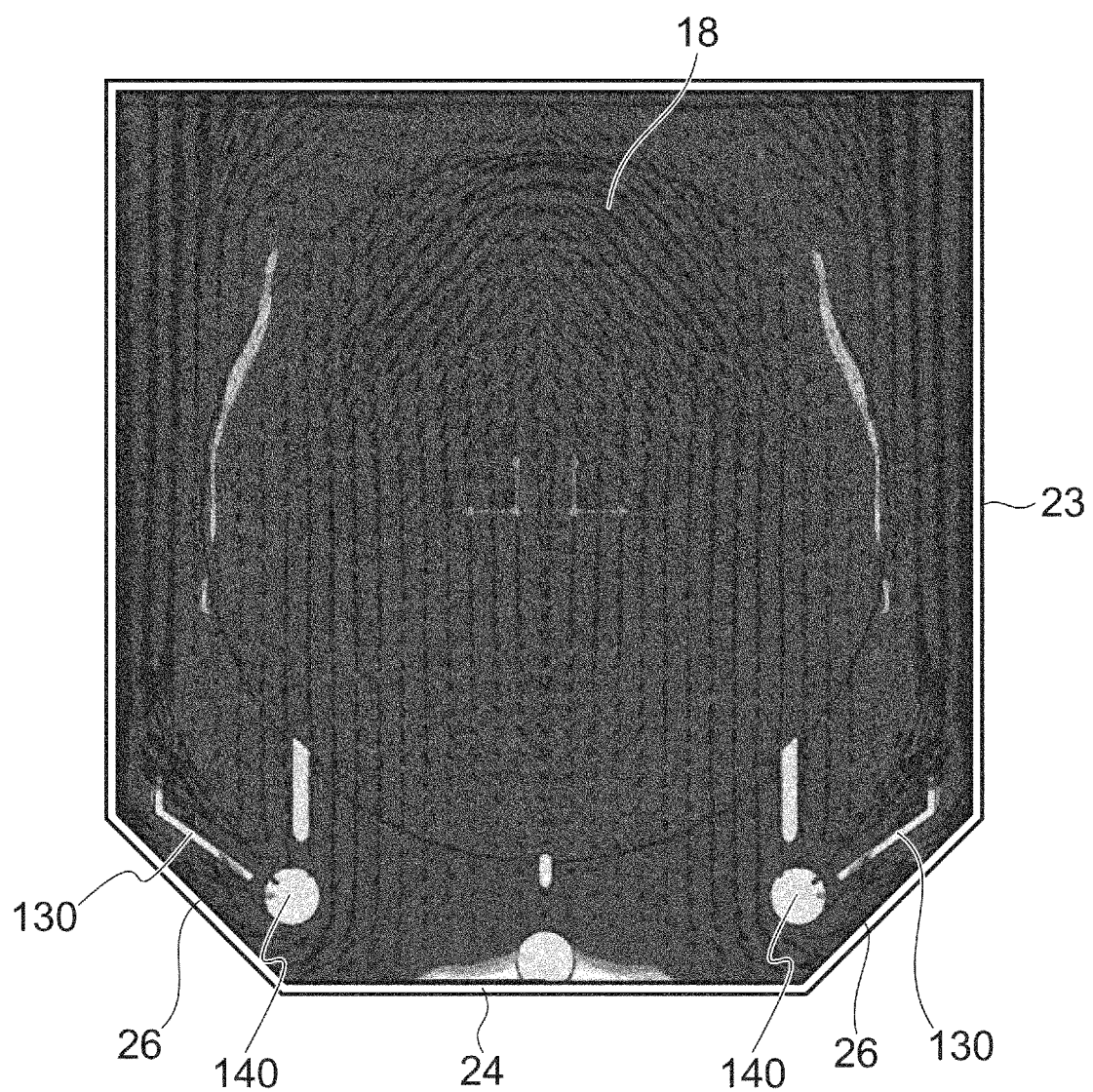
FIG. 14 is a simulation result obtained by analyzing stream flows in the substrate processing device of the third embodiment.

A simulation result as illustrated in FIG. 14 has been obtained by analyzing the stream flows in the substrate processing device 120 of the third embodiment. Similarly to the case of FIG. 2, also in FIG. 14, contrasting density of colors indicates flow speed of stream flows, and a portion with a darker color has larger flow speed. Similarly to the case of FIG. 2, also in FIG. 14, a portion with the darkest color extends throughout almost the entire regions of the front surfaces and the rear surfaces of the substrates 18. Based on the foregoing, it can be identified that, when the substrate processing device 120 processes the substrates 18, stream flows of the processing liquid with large flow speed are generated, and the processing liquid is uniformly supplied, throughout almost the entire regions of the front surfaces and the rear surfaces of the substrates 18.

FIG. 14 prominently illustrates a state in which the stream flows that have dropped toward the bottom portion of the processing bath 22 from the center vicinity of the substrates 18 pass through portions between the sloped surfaces 26 and the flow dividing plates 130, and move upward along the side surfaces 23. In this manner, it can be identified that, in the substrate processing device 120, particles that have peeled from the surfaces of the substrates 18 can be immediately eliminated from the upper opening by the stream flows moving upward along the side surfaces 23 of the processing bath 22.

4. Modified Example

The present invention is not limited to the above-described embodiments, and can be appropriately modified without departing from the scope of the present invention.

In the above-described embodiments, tubular members having a plurality of openings arrayed along a length direction, on side surfaces are used as the discharge units 14. The discharge units 14, however, are not limited to such tubular members. The discharge units 14 can be formed by linearly arranging, along the side surfaces 13 or 23, a plurality of spray nozzles that discharge processing liquid in the upward direction toward the side surfaces 13 or 23 of the processing bath 12 or 22.

The drain port 28 provided on the bottom surface of the processing bath 22 of the substrate processing device 20 of the second embodiment is not limited to a continuous groove, and may be a plurality of separately-provided holes. In this case, the plurality of holes can be respectively provided in regions on the bottom surface that correspond to portions between the substrates disposed at predetermined intervals.

In the third embodiment, the second discharge ports 140b of the discharge units 140 are assumed to be provided at positions lower than the first discharge ports 140a. The positions, however, are not limited to such positions. The second discharge ports 140b can be provided at arbitrary positions as long as the first discharge ports 140a can discharge processing liquid in a first direction, and the second discharge ports 140b can discharge processing liquid in a second direction lower than the first direction.

In the substrate processing device of the present invention, a plurality of substrates disposed at predetermined intervals can be processed using arbitrary processing liquid. In a case where processing liquid having relatively-large specific gravity, such as phosphoric acid, is used, the effects of the present invention are especially exerted.

REFERENCE SIGNS LIST 10, 20, 120 substrate processing device
12, 22 processing bath
13, 23 side surface extending along a thickness direction of a plurality of substrates
14 discharge unit
16 holder
18 substrate
24 bottom surface
26 sloped surface
28 drain port
A discharge direction of processing liquid
a1 to a7 stream flows of discharged processing liquid
a8, a9 flows of processing liquid generated by drain port

The invention claimed is:

1. A substrate processing device for processing a plurality of substrates, which are in a plate shape, comprising:
  a processing bath that is configured with a bottom surface and surrounding surfaces that surround edges of the bottom surface and extends in a height direction in order to store processing liquid, the surrounding surfaces including a pair of side surfaces that are arranged in parallel to face each other, separated by a width of the bottom surface in a width direction and extend in a length direction wherein one of the width, length and height directions is perpendicular to the other two directions, and the substrates are to intervene between the side surfaces in the width direction and to be aligned in the length direction to which a thickness of the substrates coincides,
  a pair of discharge units that are disposed in the processing bath, delivering and discharging the processing liquid, each of the discharge units extending in the length direction and having one discharging port through which the processing liquid is ejected, wherein seen in the length direction, both of the discharge units are positioned below a lowest point of the substrates in the height direction wherein the lowest point is defined as a point of the outer edge of the substrate, being the closest to the bottom surface, both of the discharge units are positioned inside two closest points of the substrates in the width direction wherein one of the closest points is defined as a point of the outer edge of the substrate, being the closest to one of the side surfaces and the other of the closest points is defined as a point of the outer edge of the substrate, being the closest to the other of the side surfaces such that each of the discharge units pairs with one of the side surfaces that is closer than the other side surface and defined as a close side surface, and both of the one discharging ports are oriented upward and toward their close side surfaces, generating two stream flows of the processing liquid by ejecting the processing liquid, wherein each of the stream flows runs upward along the close side surface, turns inward in the width direction in the vicinity of a top end of the close side surface, and meets with the other stream flow, which runs upward on the other close side surface, at a middle with respect to the width of the bottom surface such that the two stream flows become a single down flow after joining, which runs downward in the middle with respect to the width of the bottom surface.

2. The substrate processing of claim 1, wherein the single down flow is split into two return flows running toward the side surfaces when reaching the bottom surface, joining the stream flows ejected from the one discharging port, making circulations running inside the processing bath.

3. The substrate processing of claim 2, wherein the side surfaces are flat and perpendicular to the bottom surface.

4. The substrate processing of claim 1, wherein the one discharging port is composed with first and second discharge ports (140a, 140b), the first discharge port discharging a first stream flow in a first direction, and the second discharge port discharging a second stream flow in a second direction that is lower than the first direction in the height direction, and a flow dividing plate (130) is further provided between the discharge unit and the close side surface in the width direction so as to separate the first and second stream flows, the flow dividing plate including an inclined portion (131), which inclines with respect to the height direction, on a side of the discharge unit and an upstand portion (132), which extends in the height direction, on a side of the close side surface.

5. The substrate processing device of claim 4, wherein the upstand portion of the flow dividing plate rises up from an upper end of the inclined portion along the close side surface of the processing bath.

6. The substrate processing device according to claim 4, wherein the upstand portion is positioned between the closest point of the substrates and the close side surface in the width direction.

7. The substrate processing device according to claim 5, wherein the upstand portion is positioned between the closest point of the substrates and the close side surface in the width direction.

8. The substrate processing of claim 1, wherein each of the discharge units further includes a plurality of discharging ports through which the processing liquid is ejected, and these discharging ports and the one discharging port are aligned in the length direction on each of the discharge units.

9. The substrate processing of claim 8, wherein these discharging ports and the one discharging port of one of the discharge units are arranged symmetrically to those of the other discharge unit in the width direction.

10. The substrate processing of claim 1, wherein all of the substrates are arranged at the middle with respect to the width of the bottom surface such that the single down flow runs on central portions of the substrates.

* * * * *